US012658920B2

(12) United States Patent
Chen

(10) Patent No.: US 12,658,920 B2
(45) Date of Patent: Jun. 16, 2026

(54) VOLTAGE LEVEL SHIFTER

(71) Applicant: ELITE SEMICONDUCTOR MICROELECTRONICS TECHNOLOGY INC., Hsinchu (TW)

(72) Inventor: Isaac Y. Chen, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 51 days.

(21) Appl. No.: 18/764,117

(22) Filed: Jul. 3, 2024

(65) Prior Publication Data

US 2026/0012182 A1    Jan. 8, 2026

(51) Int. Cl.
H03K 19/00 (2006.01)
H03K 3/356 (2006.01)
H03K 19/0185 (2006.01)

(52) U.S. Cl.
CPC .............. H03K 19/018521 (2013.01); H03K 3/356113 (2013.01)

(58) Field of Classification Search
CPC ....... H03K 19/018521; H03K 19/0175; H03K 19/0185; H03K 17/018507; H03K 19/018557; H03K 19/018571
See application file for complete search history.

(56) References Cited

U.S. PATENT DOCUMENTS

| | | | | |
|---|---|---|---|---|
| 6,646,469 | B2 * | 11/2003 | Yushan ................ | H03K 17/063 326/83 |
| 6,781,422 | B1 * | 8/2004 | Yang ................ | H03K 17/04123 326/82 |
| 7,902,627 | B2 | 3/2011 | Dong et al. | |
| 8,008,945 | B2 * | 8/2011 | Osaka ............ | H03K 19/017545 326/80 |
| 8,044,685 | B2 * | 10/2011 | Tsu .................... | H03K 17/6871 327/108 |
| 9,966,944 | B2 | 5/2018 | Rossi et al. | |
| 10,116,297 | B1 * | 10/2018 | Wu ................ | H03K 19/018507 |
| 10,348,304 | B2 | 7/2019 | Ullmann et al. | |
| 10,374,606 | B2 * | 8/2019 | Zhu ................... | H03K 17/04123 |
| 10,749,509 | B1 * | 8/2020 | Cascio .......... | H03K 19/018514 |
| 11,329,636 | B2 | 5/2022 | Cascio et al. | |
| 2010/0123478 | A1 * | 5/2010 | Osaka ................. | H03K 17/063 326/80 |
| 2014/0340136 | A1 * | 11/2014 | Teplechuk ....... | H03K 3/356182 327/333 |
| 2017/0288672 | A1 * | 10/2017 | Schemm ........ | H03K 19/018507 |

* cited by examiner

*Primary Examiner* — Tuan T Lam

(57) ABSTRACT

A voltage level shifter includes a first voltage regulation unit, a second voltage regulation unit, a first latch unit and an output unit. The first voltage regulation unit and the second voltage regulation unit respectively receive first and second input signals and generate first and second adjustment signals respectively. The first latch unit receives the first and second adjustment signals and generates a first latch signal accordingly. The output unit generates an output signal according to the first latch signal, an input voltage and a control signal. A high logic level voltage of the output signal is greater than the respective high logic level voltages of the first input signal and the second input signal. Wherein, the first voltage regulation unit and the second voltage regulation unit are each a capacitively coupled voltage regulation unit and each includes an input capacitor. The input capacitor has no capacitance to ground at one end.

14 Claims, 9 Drawing Sheets

VOLTAGE LEVEL SHIFTER

BACKGROUND OF THE INVENTION

1. Field of the Invention

The present disclosure relates to a level shifter, and in particular to a voltage level shifter.

2. Description of the Related Art

Current voltage level shifters are extensively applied in circuits of different fields, and are primarily used to convert a voltage level of a signal (for example, converting an input/output (I/O) signal from a low supply voltage domain into a high supply voltage domain, and vice versa), so as to provide an output signal at an appropriate voltage level for normal operations of a back-end circuit.

However, during a voltage conversion process of a voltage level shifter, an internal electronic component of the voltage level shifter, for example, a transistor, needs to withstand a high voltage difference. Thus, internal electronic components of a voltage level shifter are mostly electronic components with large acceptable voltage differences; that is, large-size electronic components with large acceptable voltage differences need to be used for the voltage level conversion. However, due to the large size of such electronic components with large acceptable voltage differences as well as a large circuit area needed for layout in order to separate high-voltage and low-voltage associated circuits, existing voltage level shifters have larger circuit areas. Moreover, electronic components with large acceptable voltage differences, being affected by changes in different processes, voltages or temperatures, have different transition speeds, resulting in large propagation delays in existing voltage level shifters. In addition, electronic components with large acceptable voltage differences are susceptible to influences of turning on of parasitic elements. Furthermore, electronic components with large acceptable voltage differences can be made only by large acceptable voltage processes, leading to an issue of high manufacturing costs of existing voltage level shifters.

BRIEF SUMMARY OF THE INVENTION

Therefore, it is an object of the present disclosure to provide a voltage level shifter having a smaller circuit area and lower manufacturing costs as well as a smaller propagation delay.

Therefore, a voltage level shifter of the present disclosure includes a first voltage regulation unit, a second voltage regulation unit, a first latch unit and an output unit.

The first voltage regulation unit receives a first input signal and accordingly generates an amplified first regulation signal. The second voltage regulation unit receives a second input signal and accordingly generates an amplified second regulation signal. The first latch unit is coupled to the first voltage regulation unit and the second voltage regulation unit to receive the first regulation signal and the second regulation signal, respectively, and accordingly generates a first latch signal according to the first regulation signal and the second regulation signal. The output unit is coupled to the first latch unit to receive the first latch signal, and generates an output signal according to the first latch signal, an input voltage and a control signal, wherein a voltage of a high logic level of the output signal is greater than voltages of respective high logic levels of the first input signal and the second input signal. Each of the first voltage regulation unit and the second voltage regulation unit is a capacitively coupled voltage regulation unit, and includes an input capacitor which has no ground capacitance on one end thereof.

In the voltage level shifter according to some embodiments of the present disclosure, the second input signal and the first input signal are mutually inverted signals, the input capacitor is a high-voltage parasitic capacitor and has a first end and a second end which has no ground capacitor. Further, the first voltage regulation unit and the second voltage regulation unit are symmetrical, and each includes: a first buffer gate, having a first end receiving a corresponding one of the first input signal and the second input signal, and a second end coupled to the first end of the corresponding input capacitor and outputting a buffer signal; a first transistor, having a first end, a second end coupled to a first voltage end, and a control end coupled to the second end of the input capacitor to receive the buffer signal; a second transistor, having a first end coupled to the first latch unit and receiving a corresponding one of the first regulation signal and the second regulation signal, a second end coupled to the first end of the first transistor, and a control end receiving a corresponding one of a first switching signal and a second switching signal; a first resistor, coupled between a second voltage end and the first end of the second transistor; a second resistor, coupled between the second voltage end and the second end of the second transistor; and a clamp circuit, coupled between the control end of the first transistor and the first voltage end, and operable to clamp the buffer signal which is erroneous.

In the voltage level shifter according to some embodiments of the present disclosure, a voltage of the second voltage end is greater than or less than a voltage of the first voltage end.

The voltage level shifter according to some embodiments of the present disclosure further includes: a signal adjustment unit, receiving an input signal and coupled to the first voltage end, operable to detect whether a rising edge of the input signal is within a slope interval in which a voltage of the first voltage end rises, adjusting a position of the rising edge of the input signal if a detection result is affirmative to generate and output the first input signal and the second input signal to the first voltage regulation unit and the second voltage regulation unit, respectively, wherein the position of a rising edge of the first input signal is not within the slope interval in which the voltage of the first voltage end rises.

In the voltage level shifter according to some embodiments of the present disclosure, the signal adjustment unit includes: a detection circuit, coupled to the first voltage end, and detecting the voltage of the first voltage end to generate a detection signal; and a signal adjustment circuit, receiving the input signal, coupled to the detection signal to receive the detection signal, and generating the first input signal and the second input signal according to the input signal, the detection signal and the control signal.

In the voltage level shifter according to some embodiments of the present disclosure, the signal adjustment unit includes: a capacitor, having a first end coupled to the first voltage end, and a second end; a current mirror, coupled to the second end of the capacitor; a second current mirror, coupled to the first current mirror; and a current source, coupled between the second current mirror and a low-voltage end, wherein a common node of the current source and the second current mirror outputs the detection signal.

In the voltage level shifter according to some embodiments of the present disclosure, the signal adjustment unit includes: a logic gate, receiving the input signal, coupled to the detection circuit to receive the detection signal, and generating a logic signal according to the input signal and the detection signal; and an RS flip-flop, receiving the control signal, coupled to the logic gate to receive the logic signal, and generating the first input signal and the second input signal according to the logic signal and the control signal.

In the voltage level shifter according to some embodiments of the present disclosure, the first latch unit includes: a third transistor, having a first end coupled to a second voltage end, a second end, and a control end coupled to the first voltage regulation unit to receive the first regulation signal; a fourth transistor, having a first end coupled to the second voltage end, a second end, and a control end coupled to the second voltage regulation unit to receive the second regulation signal; and a latch circuit, coupled to the second ends of the third transistor and the fourth transistor, operable to latch a potential of one of the second ends of the third transistor and the fourth transistor to generate the first latch signal.

In the voltage level shifter according to some embodiments of the present disclosure, the output unit includes: a second buffer gate, having a first end coupled to the first latch unit to receive the first latch signal, a second end coupled to a first voltage end, a third end coupled to a second voltage end, and an output end outputting a buffer control signal; a fifth transistor, having a first end receiving the input voltage, a second end coupled to the first voltage end and outputting the output signal, and a control end coupled to the output end of the second buffer gate to receive the buffer control signal; and a sixth transistor, having a first end coupled to the second end of the fifth transistor, a second end which is grounded, and a control end receiving the control signal.

In the voltage level shifter according to some embodiments of the present disclosure, the second input signal and the first input signal are in-phase signals; the input capacitor has a first end, and a second end which has no ground capacitance and outputs a corresponding one of the first regulation signal and the second regulation signal; each of the first voltage regulation unit and the second voltage regulation unit further includes: a buffer gate, having a first end receiving a corresponding one of the first input signal and the second input signal, and a second end coupled to the first end of the corresponding input capacitor and outputting a buffer signal; and a clamp circuit, coupled between a corresponding one of a first voltage end and a second voltage end and the second end of the corresponding input capacitor, operable to clamp a corresponding one of the first regulation signal and the second regulation signal which is erroneous.

In the voltage level shifter according to some embodiments of the present disclosure, a potential of each of the first regulation signal and the second regulation signal follows a potential of the first voltage end.

In the voltage level shifter according to some embodiments of the present disclosure, the clamp circuit includes: a first transistor and a second transistor, connected in series between a corresponding one of the first voltage end and the second voltage end and the second end of the corresponding input capacitor; and a resistor, coupled between a corresponding one of the first voltage end and the second voltage end and the second end of the corresponding input capacitor.

In the voltage level shifter according to some embodiments of the present disclosure, each of the first voltage regulation unit and the second voltage regulation unit further includes: a third transistor, having a first end coupled to the second end of the corresponding input capacitor, a second end coupled to the corresponding resistor, and a control end; wherein the control end of the third transistor of the first voltage regulation unit is coupled to the second end of the third transistor of the second voltage regulation unit, and the control end of the third transistor of the second voltage regulation unit is coupled to the second end of the third transistor of the first voltage regulation unit.

In the voltage level shifter according to some embodiments of the present disclosure, the first latch unit includes: a fourth transistor, having a first end coupled to the second voltage end, a second end, and a control end coupled to the first voltage regulation unit to receive the first regulation signal, the fourth transistor being a P-type metal oxide semiconductor field-effect transistor (PMOSFET); a fifth transistor, having a first end coupled to the second end of the fourth transistor, a second end coupled to the first voltage end, and a control end coupled to the second voltage regulation unit to receive the second regulation signal, the fifth transistor being an N-type metal oxide semiconductor field-effect transistor (NMOSFET); and output capacitor, coupled between the first voltage end and the second voltage end; and a latch circuit, coupled to the first end of the fifth transistor, operable to latch a potential of the first end of the fifth transistor to generate the first latch signal.

In the voltage level shifter according to some embodiments of the present disclosure, the output unit includes: an inverter, having a first end coupled to the first latch unit to receive the first latch signal, and a second end outputting an inverted signal; a sixth transistor, having a first end receiving the input voltage, a second end coupled to the first voltage end and outputting the output signal, and a control end coupled to the second end of the inverter to receive the inverted signal; and a seventh transistor, having a first end coupled to the second end of the sixth transistor, a second end which is grounded, and a control end receiving the control signal.

The voltage level shifter according to some embodiments of the present disclosure further includes: a third voltage regulation unit, coupled to the second end of the inverter to receive the inverted signal, and accordingly generating an amplified third regulation signal; a fourth voltage regulation unit, coupled to the second end of the inverter to receive the inverted signal and accordingly generating an amplified fourth regulation signal; a second latch unit, coupled to the third voltage regulation unit and the fourth voltage regulation unit to receive the third regulation signal and the fourth regulation signal, respectively, and generating a second latch signal according to the third regulation signal and the fourth regulation signal.

BRIEF DESCRIPTION OF THE DRAWINGS

Other features and effects of the present disclosure will become more readily apparent in the embodiments described with reference to the accompanying drawings, wherein.

DETAILED DESCRIPTION OF THE INVENTION

In the following disclosure of the present disclosure, details of the present disclosure are given by way of the embodiments with reference to the accompanying drawings, so as to help a person skilled in the art to better understand the objects, features and effects of the present disclosure. It should be noted that, in the description below and the appended claims, the terms "include" and "comprise" are used in the sense of an open manner, and are not to be construed as closed terms such as "consisting of . . . ". Moreover, the term "couple" is intended to represent indirect or direct coupling. Thus, if one apparatus is coupled to another apparatus, the connection in between can be implemented by direct coupling or be implemented by indirect coupling achieved with another apparatus in between. Moreover, in the detailed description and claims below, terms such as "first", "second" and "third" are used to distinguish differences among elements, and are not to be construed as limiting the elements themselves or representing specific orders of the elements. Before the detailed description of the present disclosure is provided, it should be noted that similar elements in different embodiments are denoted by the same symbols or numerals in the disclosure below.

Figure 1:
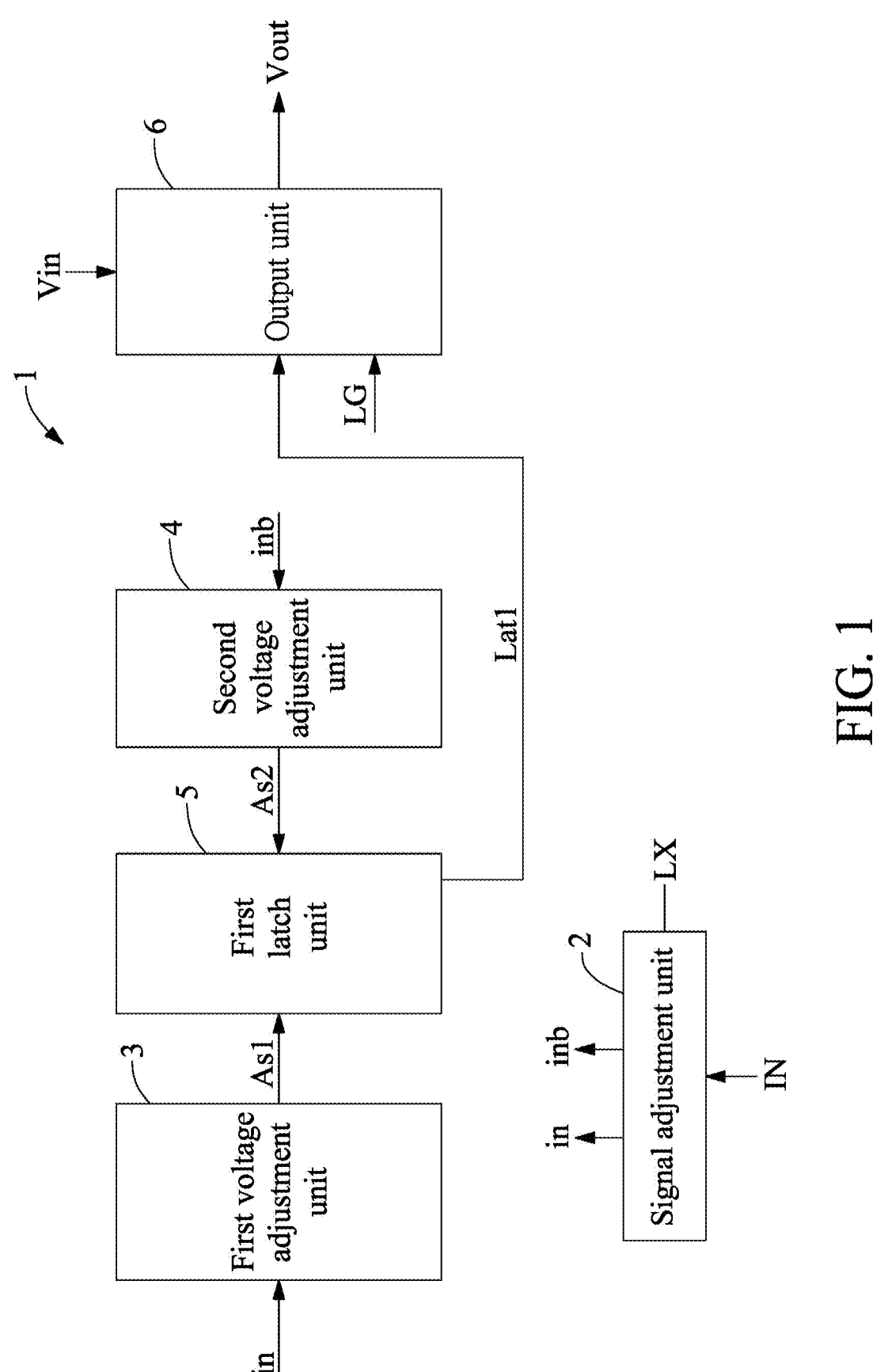
FIG. 1 is a block diagram of a voltage level shifter according to an embodiment of the present disclosure.
Figure 2:
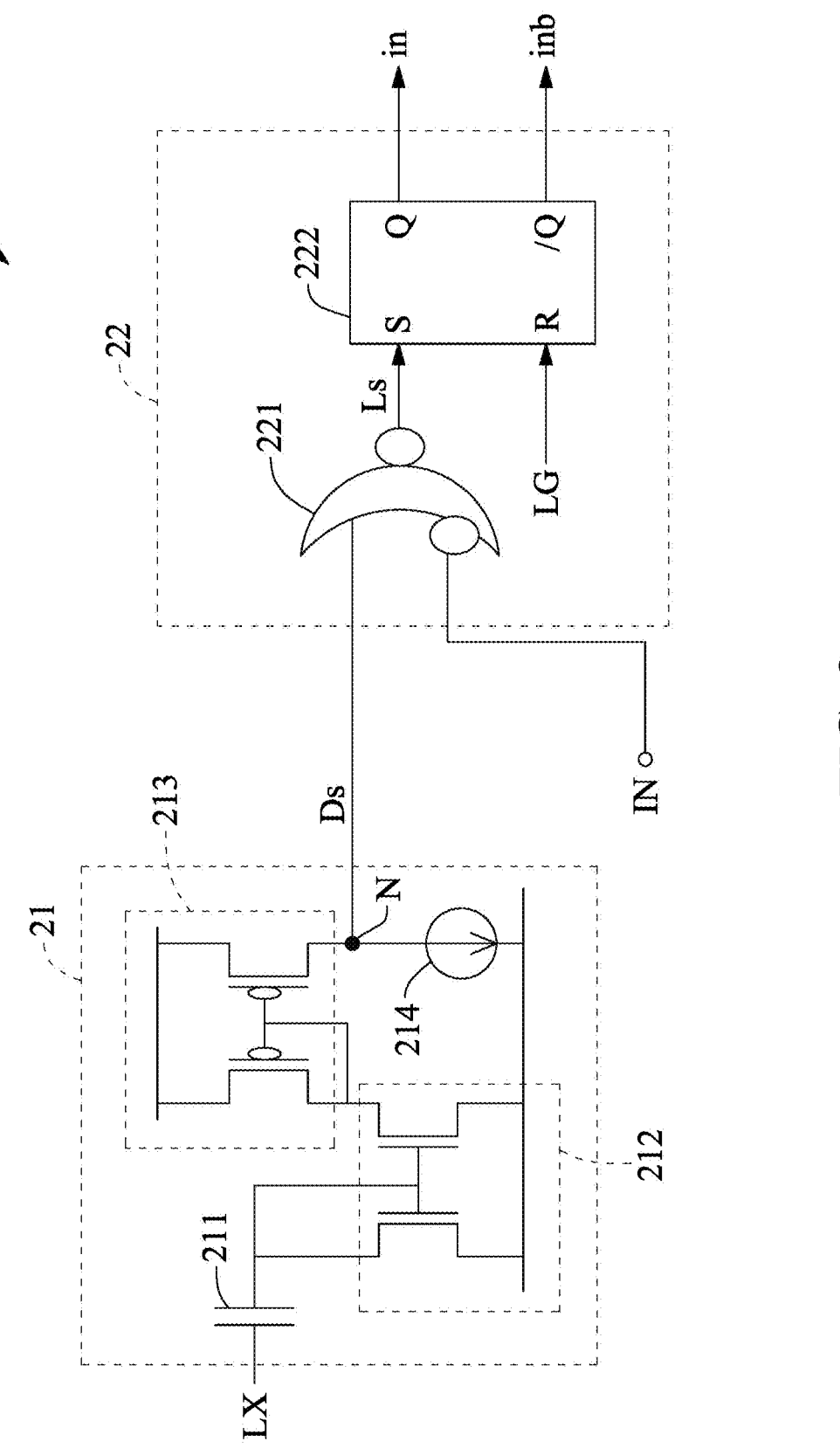
FIG. 2 is a circuit diagram of a signal adjustment unit of the embodiment.
Figure 3:
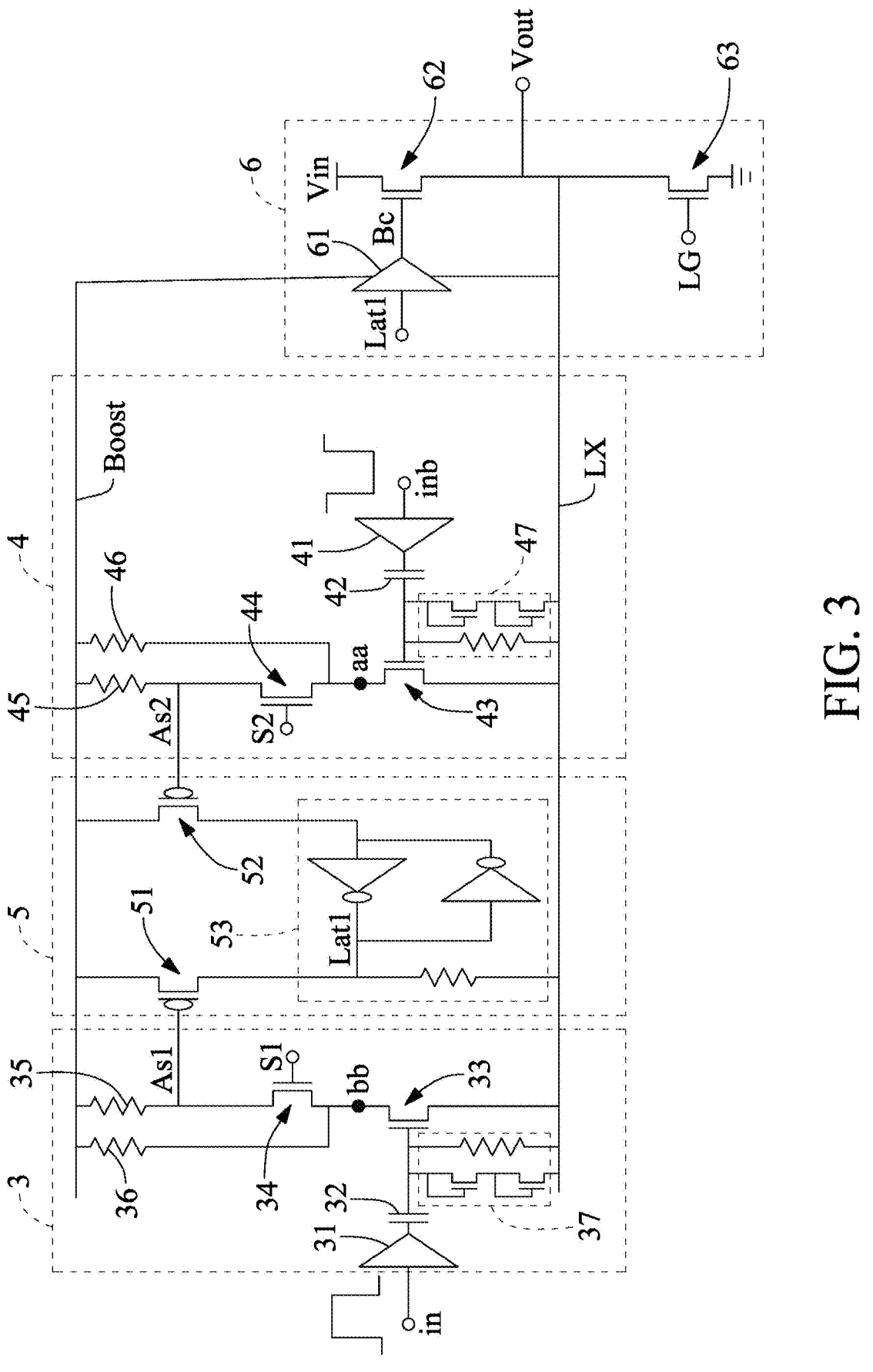
FIG. 3 is a circuit diagram of a first voltage regulation unit, a second voltage regulation unit, a first latch unit and an output unit according to the embodiment.

Refer to FIG. 1 to FIG. 3 for a voltage level shifter 1 according to an embodiment of the present disclosure. The voltage level shifter 1 includes a signal adjustment unit 2, a first voltage regulation unit 3, a second voltage regulation unit 4, a first latch unit 5 and an output unit 6.

The signal adjustment unit 2 receives an input signal IN and is coupled to a first voltage end LX, and is operable to detect whether a rising edge of the input signal IN is located within a slope interval in which a voltage of the first voltage end LX rises. When the detection result is affirmative, a position of the rising edge of the input signal IN is adjusted to generate a first input signal (in) and a second input signal (inb). The second input signal (inb) and the first input signal (in) are mutually inverted signals. The position of the rising edge of the first input signal (in) is not within the slope interval of the voltage of the first voltage end LX rises, and accordingly a failure of normal transition of the first latch unit 5 as a result that the rising edge of the input signal IN is located within the slope interval (at this point, first transistors 33 and 43 in FIG. 3 cannot be turned on, and the first voltage regulation unit 3 and the second voltage regulation unit 4 are unable to function normally) in which the voltage of the first voltage end LX rises can be prevented. The voltage of the first voltage end LX has a range between, for example, 0 V and 25 V. In this embodiment, the signal adjustment unit 2 includes a detection circuit 21 and a signal adjustment circuit 22.

The detection circuit 21 is coupled to the first voltage end LX, and detects the voltage of the first voltage end LX to generate a detection signal Ds. In this embodiment, the detection circuit 21 includes a capacitor 211, a first current mirror 212, a second current mirror 213 and a current source 214.

The capacitor 211 has a first end coupled to the first voltage end LX, and a second end. The first current mirror 212 is coupled to the second end of the capacitor 211. The second current mirror 213 is coupled to the first current mirror 212. The current source 214 is coupled between the second current mirror 213 and a low-voltage end, and a common node N of the current source 214 and the second current mirror 213 outputs the detection signal Ds. In this embodiment, the first current mirror 212 includes, for example but not limited to, two N-type metal oxide semiconductor field effect transistors (NMOSFETs); the second current mirror 213 includes, for example but not limited to, two P-type metal oxide semiconductor field effect transistors (PMOSFETs).

The signal adjustment circuit 22 receives the input signal IN, is coupled to the detection circuit 21 to receive the detection signal, and generates the first input signal (in) and the second input signal (inb) according to the input signal IN, the detection signal Ds and a control signal LG. In this embodiment, the signal adjustment unit 22 includes a logic gate 221 and an RS flip-flop 222.

The logic gate 221 receives the input signal IN, is coupled to the common node N of the detection circuit 21 to receive the detection signal Ds, and generates a logic signal Ls according to the input signal IN and the detection signal Ds. The RS flip-flop 222 has a first receiving end S coupled to the logic gate 221 to receive the logic signal Ls, a second receiving end R receiving the control signal LG, and two output ends Q and /Q. The RS flip-flop 222 generates the first input signal (in) and the second input signal (inb) at the output ends Q and /Q according to the logic signal Ls and the control signal LG, respectively. In this embodiment, the logic gate 221 is a NOR gate, of which one end receiving the inverted input signal IN.

The first voltage regulation unit 3 is coupled to the output end Q of the RS flip-flop 222 to receive the first input signal (in), and accordingly generates an amplified first regulation signal As1. The second voltage regulation unit 4 is coupled to the output end /Q of the RS flip-flop 222 to receive the second input signal (inb), and accordingly generates an amplified second regulation signal As2. In this embodiment, the first voltage regulation unit 3 includes a first buffer gate 31, an input capacitor 32, a first transistor 33, a second transistor 34, a first resistor 35, a second resistor 36 and a clamp circuit 37. The second voltage regulation unit 4 includes a first buffer gate 41, an input capacitor 42, a first transistor 43, a second transistor 44, a first resistor 45, a second resistor 46 and a clamp circuit 47. Each of the first transistors 33 and 43 and the second transistors 34 and 44 is an NMOSFET. Each of the first voltage regulation unit 3 and the second voltage regulation unit 4 is a capacitively coupled voltage regulation unit. Since the first voltage regulation unit 3 and the second voltage regulation unit 4 are in a symmetrical structure, for the sake of brevity, the first voltage regulation unit 3 is taken as an example below to describe connections of internal elements thereof.

The first buffer gate 31 has a first end receiving the first input signal (in), and a second end outputting a buffer signal. The input capacitor 32 is operable for capacitive coupling, and has a first end coupled to the second end of the first buffer gate 31 to receive the buffer signal and a second end having no ground capacitance. The first transistor 33 has a first end, a second end coupled to the first voltage end LX, and a control end coupled to the second end of the input capacitor 32 to receive the buffer signal. The second transistor 34 has a first end coupled to the first latch unit 5 and outputting the first regulation signal As1, a second end coupled to the first end of the first transistor 33, and a control end receiving a first switching signal S1 (that is, a corresponding one of the first switching signal S1 and the second switching signal S2). The first resistor 35 is coupled between a second voltage end Boost and the first end of the second transistor 34. The second resistor 36 is coupled between the second voltage end Boost and the second end of the second transistor 34. The clamp circuit 37 is coupled between the control end of the first transistor 33 and the first voltage end LX, and is operable to clamp the buffer signal which is erroneous. The clamp circuit 37 includes, for example but not limited to, two NMOSFETs and a resistor. A voltage of the second voltage end Boost has a range between, for example, 25V and 30V. A voltage (represented by "aa" in FIG. 3) of the first end of the first transistor 43 is used as the first switching signal S1. A voltage (represented by "bb" in FIG. 3) of the first end of the first transistor 33 is used as the second switching signal S2.

Figure 4C:
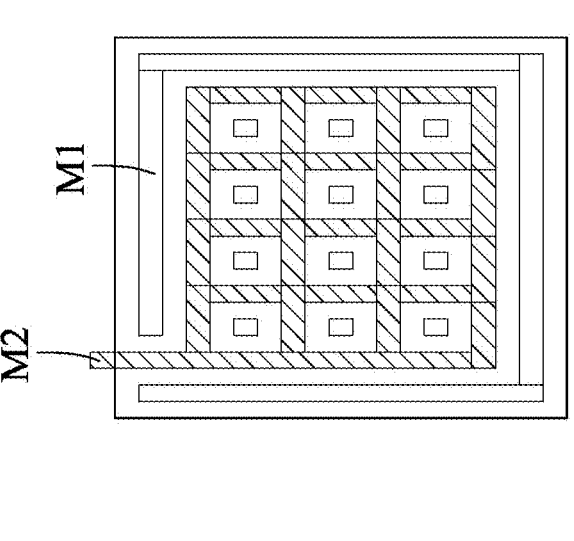
FIGS. 4A, 4B and 4C are schematic diagrams of a layout of an input capacitor according to the embodiment.
Figure 4C:
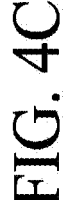
Figure 4B:
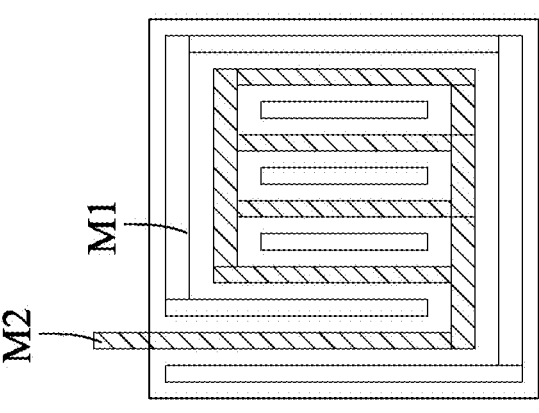
Figure 4B:
Figure 4A:
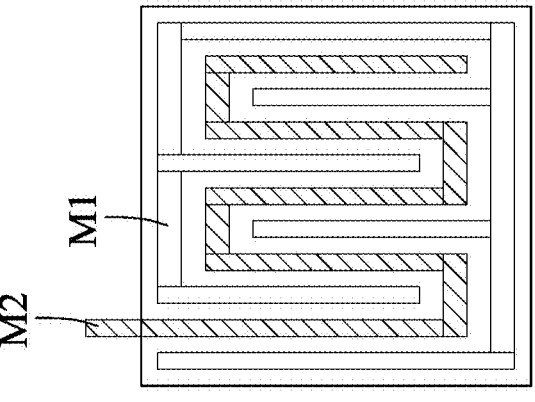

It should be noted that, further referring to FIG. 4A to FIG. 4C, in terms of layout, the input capacitor 32 (42) (50 fF) is a metal-metal high-voltage parasitic capacitor generated by a metal line between a metal line M1 at the first end of the first buffer 31 (41) and a metal line M2 at the control end of the first transistor 33 (43). The present disclosure substitutes the input capacitors 32 and 42 for current transistors with large acceptable voltage differences, so as to form a single-chip, compact capacitive voltage level shifter. With the structure above, because the voltage level shifter 1 does not need to be provided with transistors with large acceptable voltage differences and hence has smaller circuit areas, and thus does not have different transition speeds resulted from changes in different processes, voltages or temperatures, the voltage level shifter 1 has a smaller propagation delay. In addition, because the voltage level shifter 1 does not need to be provided with transistors with large acceptable voltage differences, the voltage level shifter 1 does not involve high-voltage manufacturing processes and accordingly has lower manufacturing costs. Moreover, in terms of layout of the present disclosure, the metal line M1 at the first end of the first buffer gate 31 (41) is used to surround the metal line M2 at the control end of the first transistor 33 (43) (that is, the control end of the first transistor 33 serving as a receiver node can be shielded by the first buffer gate 31 serving as a transmitter), such that the second end of the input capacitor 32 has no ground capacitance, hence preventing signals received by the first transistor 33 (43) from being attenuated by the presence of ground capacitance of the control end of the first transistor 33 (43).

The first latch unit 5 is coupled to the first ends of the second transistor 34 and the second transistor 44 to receive the first regulation signal As1 and the second regulation signal As2, respectively, and accordingly generates a first latch signal Lat1 according to the first regulation signal As1 and the second regulation signal As2.

In this embodiment, the first latch unit 5 includes a third transistor 51, a fourth transistor 52 and a latch circuit 53. The third transistor 51 has a first end coupled to the second voltage end Boost, a second end, and a control end coupled to the first end of the second transistor 34 to receive the first regulation signal As1. The fourth transistor 52 has a first end coupled to the second voltage end Boost, a second end, and a control end coupled to the first end of the second transistor 44 to receive the second regulation signal As2. The latch circuit 53 is coupled to the second ends of the third transistor 51 and the fourth transistor 52, and is operable to latch a potential of one of the second ends of the third transistor 51 and the fourth transistor 52 so as to generate the first latch signal Lat1. In this embodiment, the latch circuit 53 includes two inverters and a resistor. Each of the third transistor 51 and the second transistor 52 is a PMOSFET.

The output unit 6 is coupled to the latch unit 53 to receive the first latch signal Lat1, and generates an output signal Vout according to the first latch signal Lat1, an input voltage Vin and the control signal LG. A voltage of a high logic level of the output signal Vout is greater than voltages of respective high logic levels of the first input signal (in) and the second input signal (inb).

In this embodiment, the output unit 6 includes a second buffer gate 61, a fifth transistor 62 and a sixth transistor 63. The second buffer gate 6 has a first end coupled to the latch circuit 53 to receive the first latch signal Lat1, a second end coupled to the first voltage end LX, a third end coupled to the second voltage end Boost, and an output end. The second buffer gate 6 generates and outputs a buffer control signal Bc at its output end according to the first latch signal Lat1 and the potentials of the first voltage end LX and the second voltage end Boost. The fifth transistor 62 has a first end receiving the input voltage Vin, a second end coupled to the first voltage end LX and outputting the output signal Vout, and a control end coupled to the output end of the second buffer gate 61 to receive the buffer control signal Bc. The sixth transistor 63 has a first end coupled to the second end of the fifth transistor 62, a second end which is grounded, and a control end receiving the control signal LG. Each of the fifth transistor 62 and the sixth transistor 63 is an NMOSFET.

It should be noted that, in this embodiment, the voltage of the second voltage end Boost is, for example but not limited to, greater than the voltage of the first voltage end LX. In other embodiments, the voltage of the second voltage end Boost can be less than the voltage of the first voltage end LX, and in the first voltage regulation unit 3, the second voltage regulation unit 4 and the first latch unit 5, each NMOSFET is replaced by a PMOSFET and each PMOSFET is replaced by an NMOSFET.

Figure 5:
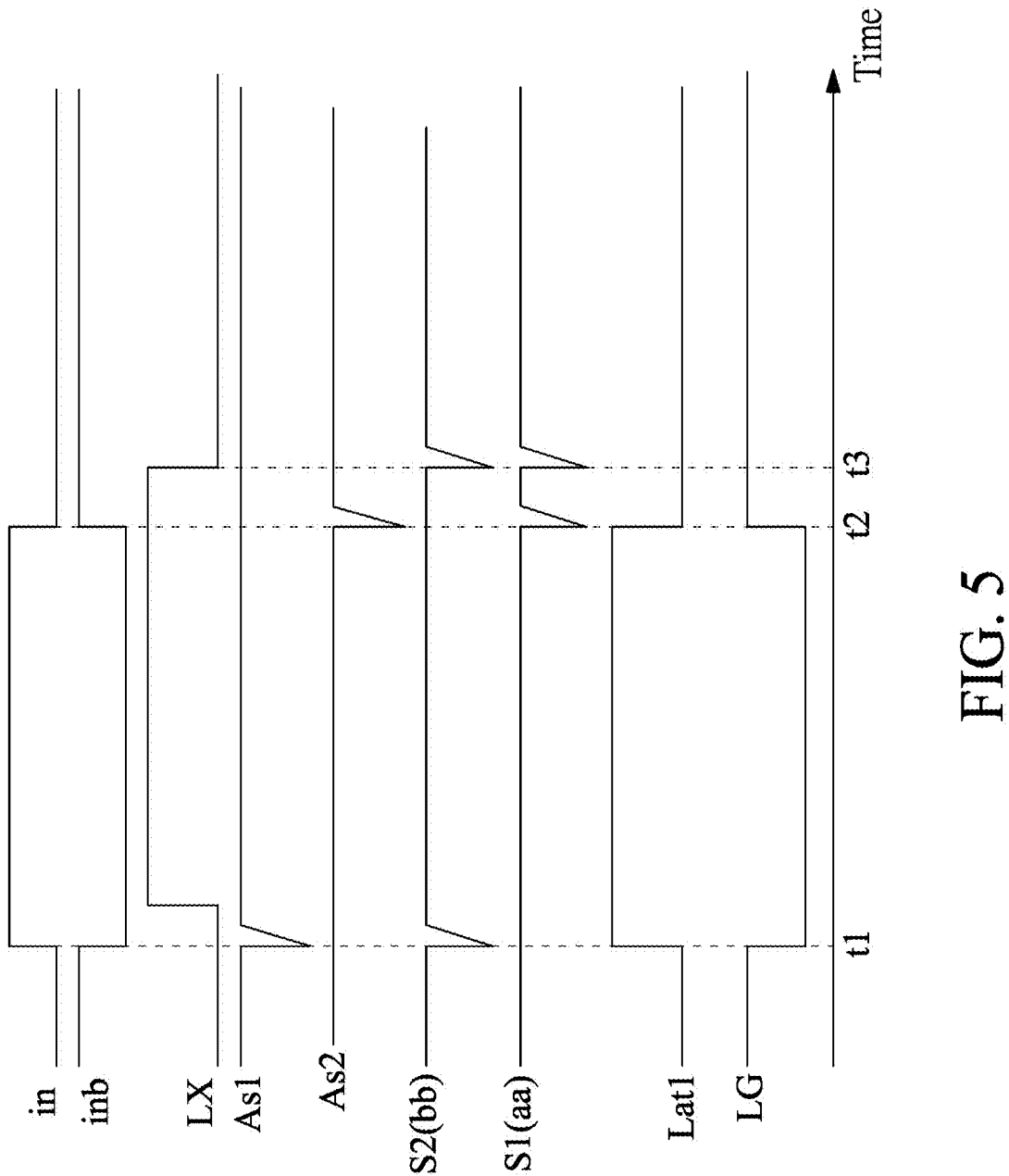
FIG. 5 is a waveform diagram of waveforms of a first input signal, a second input signal, a signal of a first voltage end, a first regulation signal, a second regulation signal, a first switching signal, a second switching signal, a first latch signal and a control signal.
Figure 6:
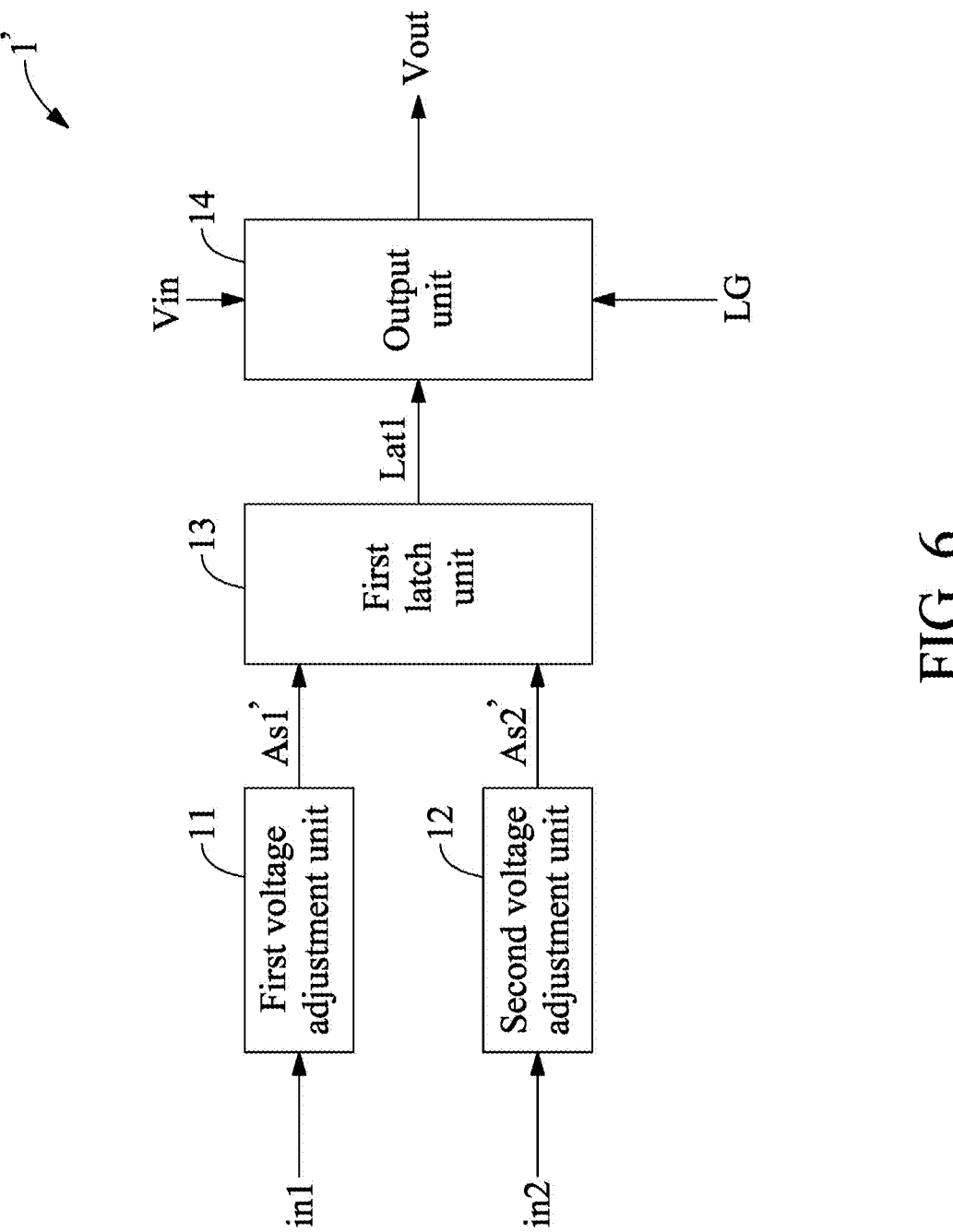
FIG. 6 is a block diagram of a voltage level shifter according to another embodiment of the present disclosure.
Figure 7:
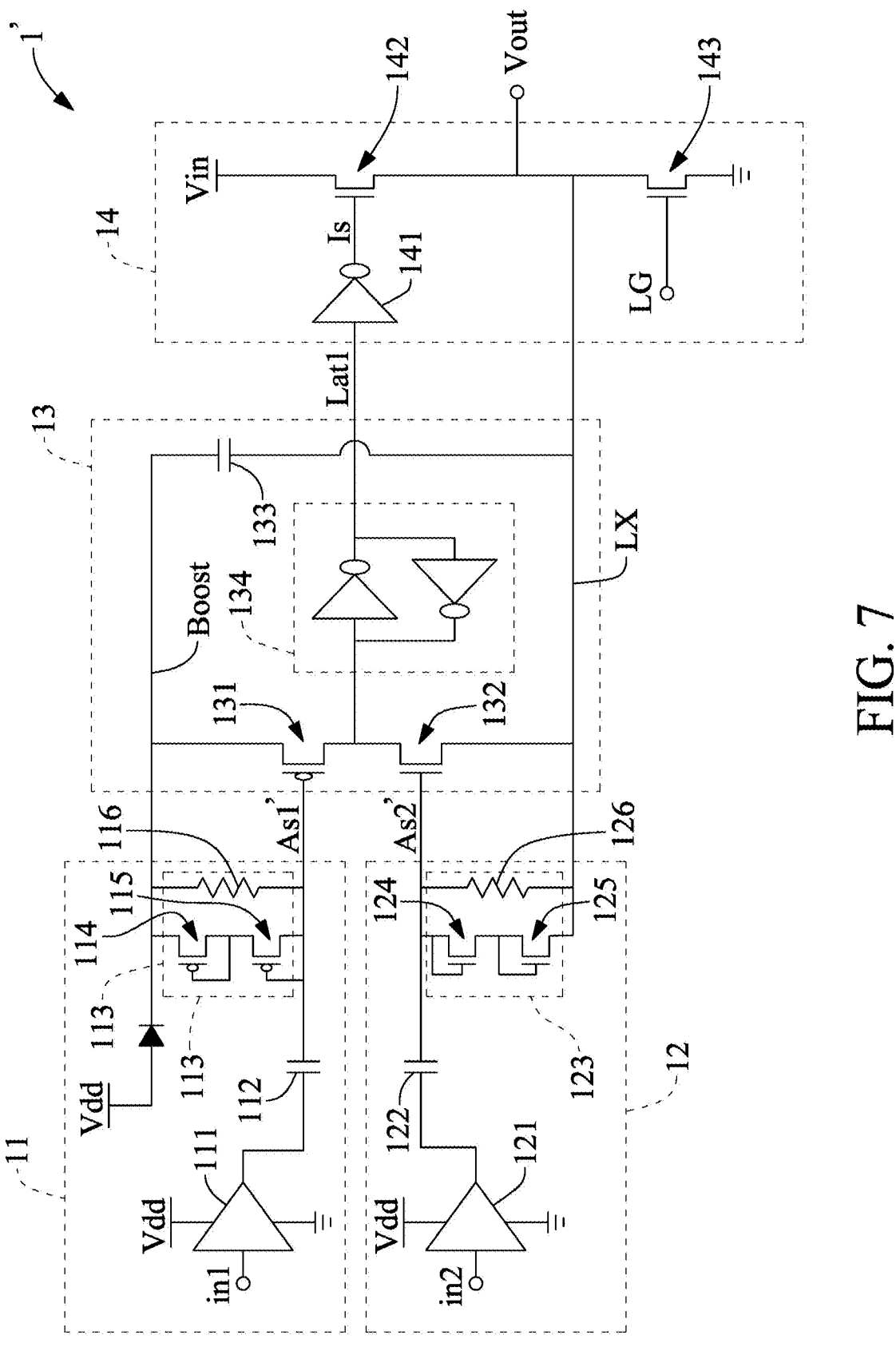
FIG. 7 is a circuit diagram of a first voltage regulation unit, a second voltage regulation unit, a first latch unit and an output unit according to another embodiment.

Further referring to FIG. 3 and FIG. 5, the operation of the voltage level shifter 1 of this embodiment is described below.

At a timing t1, in the first voltage regulation unit 3, the first transistor 33 and the second transistor 34 are turned on, and the voltage (bb) of the first end of the first transistor 33 is temporarily pulled down because the first transistor 33 is turned on, such that the first regulation signal As1 output by the first voltage regulation unit As1 temporarily has a low logic level, the third transistor 51 is accordingly turned on, and the first latch signal Lat1 transitions from a low logic level to a high logic level, until a timing t2. Meanwhile, in the second voltage regulation unit 4, the first transistor 43, the second transistor 44 and the fourth transistor 52 are turned off, and the second voltage regulation unit 4 does not generate the second regulation signal As2. Since the first latch signal Lat1 transitions from a low logic level to a high logic level and the buffer control signal Bc accordingly has a high logic level, the fifth transistor 62 is turned on, the sixth transistor 63 is controlled by the control signal LG and is turned off, and the voltage of the output signal Vout output by the output unit 6 has a high level.

At the timing t2, in the first voltage regulation unit 3, the first transistor 33, the second transistor 34 and the third transistor 51 are turned off, and the first voltage regulation unit 3 does not generate the first regulation signal As1. Meanwhile, in the second voltage regulation unit 4, the first transistor 43 and the second transistor 44 are turned on, and the voltage (aa) of the first end of the first transistor 43 is temporarily pulled down because the first transistor 43 is turned on, such that the second regulation signal As2 output by the second voltage regulation unit 4 temporarily has a low logic level, the fourth transistor 52 is accordingly turned on, and the first latch signal Lat1 transitions from a high logic level to a low logic level. Since the first latch signal Lat1 transitions from a high logic level to a low logic level and the buffer control signal Bc accordingly has a low logic level, the fifth transistor 62 is turned off, the sixth transistor 63 is controlled by the control signal LG and is turned on, and the voltage of the output signal Vout output by the output unit 6 has a low level.

It should be noted that, during a normal operation, when the first voltage regulation unit 3 operates to generate the first regulation signal As1, the second voltage regulation unit 4 does not generate the second regulation signal As2. When the second voltage regulation unit 4 operates to generate the second regulation signal As2, the first voltage regulation unit 3 does not generate the first regulation signal As1. When the first voltage regulation unit 3 and the second voltage regulation unit 4 operate simultaneously (that is, at a timing t3 when the potential of the first voltage end LX changes to a low logic level), the voltage level shifter 1 can be affected by a common-mode voltage of the first input signal (in) and the second input signal (inb). To prevent the occurrence of the above, at a timing t3, the voltages of the first switching signal S1 and the second switching signal S2 are temporarily pulled down to turn off the second transistors 34 and 44, and thus the voltage level shifter 1 can be prevented from influences the common-mode voltage of the first input signal (in) and the second input signal (inb).

Refer to FIG. 1 to FIG. 7 for a voltage level shifter 1' according to another embodiment of the present disclosure. The voltage level shifter 1' is similar to the voltage level shifter 1 in FIG. 1, and the two differs in that, in this embodiment, a first voltage regulation unit 11, a second voltage regulation unit 12, a first latch unit 13 and an output unit 14 used to substitute for the first voltage regulation unit 3, the second voltage regulation unit 4, the first latch unit 5 and the output unit 6, respectively, and the signal adjustment unit 2 in FIG. 1 is omitted.

The first voltage regulation unit 11 includes a buffer gate 111, an input capacitor 112 and a clamp circuit 113. The first buffer gate 111 has a first end receiving a first input signal (in1), a second end outputting a buffer signal, a third end receiving a supply voltage Vdd, and a fourth end which is grounded. The input capacitor 112 has a first end coupled to the second end of the first buffer gate 111 to receive the buffer signal, and a second end having no ground capacitance and outputting a first regulation signal As1'. The clamp circuit 113 is coupled between the second voltage end Boost and the second end of the input capacitor 112, and is operable to clamp the first regulation signal As1' which is erroneous. The clamp circuit 113 includes a first transistor 114, a second transistor 115 and a resistor 116. The first transistor 114 and the second transistor 115 are connected in series between the second voltage end Boost and the second end of the input capacitor 112. The resistor 116 is coupled between the second voltage end Boost and the second end of the input capacitor 112. Each of the first transistor 114 and the second transistor 115 is a PMOSFET.

The second voltage regulation unit 12 includes a buffer gate 121, an input capacitor 122 and a clamp circuit 123. The buffer gate 121 has a first end receiving a second input signal (in2), a second end outputting a buffer signal, a third end receiving the supply voltage Vdd, and a fourth end which is grounded. The input capacitor 122 has a first end coupled to the second end of the buffer gate 121 to receive the buffer signal, and a second end having no ground capacitance and outputting a second regulation signal As2'. The second input signal (in2) and the first input signal (in1) are in-phase signals. The clamp circuit 123 is coupled between the first voltage end LX and the second end of the input capacitor 122, and is operable to clamp the second regulation signal As2' which is erroneous. The clamp circuit 123 includes a first transistor 124, a second transistor 125 and a resistor 126. The first transistor 124 and the second transistor 125 are connected in series between the first voltage end LX and the second end of the input capacitor 122. The resistor 126 is coupled between the first voltage end LX and the second end of the input capacitor 122. Each of the first transistor 124 and the second transistor 125 is an NMOSFET. It should be noted that, each of the buffers 111 and 121 operates within an operating voltage range which ranges between the supply voltage Vdd and the ground voltage. Each of the input capacitors 112 and 122 has a same layout and same effects as those of the input capacitor 32 (that is, the voltage level shifter 1' does not need to be provided with a transistor with large acceptable voltage differences) and is similarly a metal-metal high-voltage parasitic capacitor, and a metal line at the control end of the fourth transistor 131 (the fifth transistor 132) is surrounded by a metal line at the first end of the buffer gate 111 (121), such that the second end of each of the input capacitors 112 and 122 has no ground capacitance. A potential of each of the first regulation signal As1' and the second regulation signal As2' follows a potential of the first voltage end LX.

The first latch unit 13 includes a fourth transistor 131, a fifth transistor 132, an output capacitor 133 and a latch circuit 134. The fourth transistor 131 has a first end coupled to the second voltage end Boost, a second end, and a control end coupled to the first voltage regulation unit 11 to receive the first regulation signal As1'. The fifth transistor 132 has a first end coupled to the second end of the fourth transistor 131, a second end coupled to the first voltage end LX, and a control end coupled to the second voltage regulation unit 12 to receive the second regulation signal As2'. The output capacitor 133 is coupled between the first voltage end LX and the second voltage end Boost. The latch circuit 134 is coupled to the first end of the fifth transistor 132, and is operable to latch a potential of the first end of the fifth transistor 132 to generate the first latch signal Lat1. The latch circuit 134 includes two inverters, wherein an output end of one of the inverters is coupled to an input end of the other inverter. The fourth transistor 131 is a PMOSFET. The fifth transistor 132 is an NMOSFET. It should be noted that, in this embodiment, the second input signal (in2) and the first input signal (in1) are in-phase signals, and the potential of each of the first regulation signal As1' and the second regulation signal As2' follows the potential of the first voltage end LX. Thus, when the potential of the first voltage end LX rises, the fourth transistor 131 is turned on and the fifth transistor 132 is turned off; when the potential of the first voltage end LX lowers, the fourth transistor 131 is turned off and the fifth transistor 132 is turned on. As such, the voltage level shifter 1' is prevented from the situation where both of the fourth transistor 131 and the fifth transistor 132 are simultaneously turned on (which causes the voltage level shifter 1' to be affected by a common-mode voltage), further preventing the voltage level shifter 1' from influences of the common-mode voltage of the first input signal (in1) and the second input signal (in2).

The output unit 14 includes an inverter 141, a sixth transistor 142 and a seventh transistor 143. The inverter 141 has a first end coupled to the latch circuit 134 to receive the first latch signal Lat1, and a second end. The inverter 141 outputs an inverted signal Is at its second end according to the first latch signal Lat1. The sixth transistor 142 has a first end receiving the input voltage Vin, a second end coupled to the first voltage end LX and outputting the output signal Vout, and a control end coupled to the second end of the inverter 141 to receive the inverted signal Is. The seventh transistor 143 has a first end coupled to the second end of the sixth transistor 142, a second end which is grounded, and a control end receiving the control signal LG. Each of the sixth transistor 142 and the seventh transistor 143 is an NMOSFET.

During operation, when the fourth transistor 131 is turned on and the fifth transistor 132 is turned off, the first latch signal Lat1 generated by the latch circuit 134 has a low logic level "0", such that the inverted signal Is has a high logic level, the sixth transistor 142 is turned on, and the seventh transistor 143 controlled by the control signal LG is turned off. Accordingly, a voltage of the output signal Vout output by the output unit 14 has a high level.

When the fourth transistor 131 is turned off and the fifth transistor 132 is turned on, the first latch signal Lat1 generated by the latch circuit 134 has a high logic level "1", such that the inverted signal Is has a low logic level, the sixth transistor 142 is turned off, and the seventh transistor 143 controlled by the control signal LG is turned on. Accordingly, the voltage of the output signal Vout output by the output unit 14 has a low level.

Figure 8:
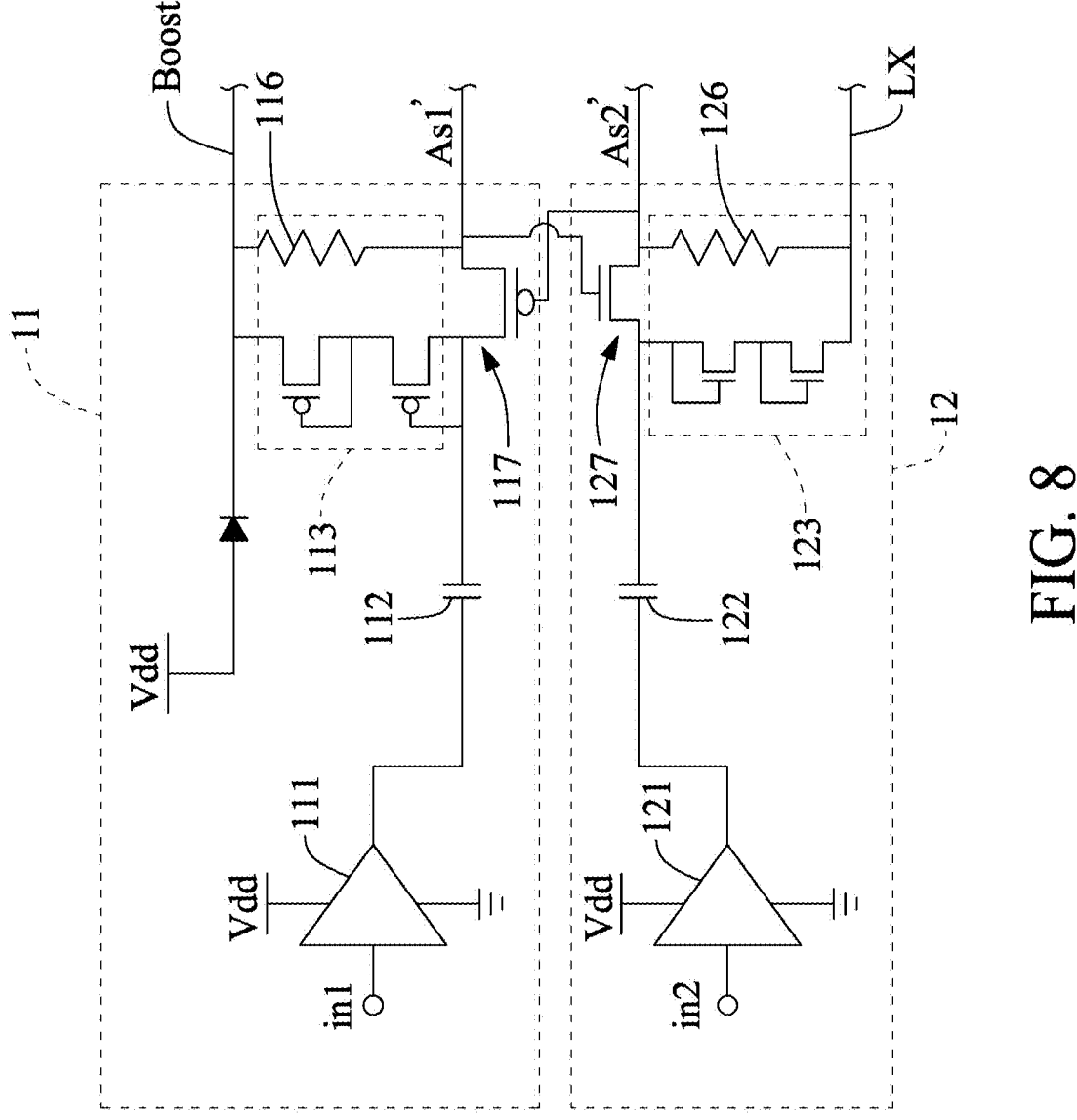
FIG. 8 is a circuit diagram of a first voltage regulation unit according to another embodiment and a second voltage regulation unit according to another embodiment.

Refer to FIG. 8 showing the first voltage regulation unit 11 and the second voltage regulation unit 12 according to another embodiment. The first voltage regulation unit 11 further includes a third transistor 117, which has a first end coupled to the second end of the input capacitor 112, a second end coupled to the resistor 116, and a control end. The second voltage regulation unit 12 further includes a third transistor 127, which has a first end coupled to the second end of the input capacitor 122, a second end coupled to the resistor 126, and a control end. The control end of the third transistor 117 is coupled to the second end of the third transistor 127, and the control end of the third transistor 127 is coupled to the second end of the third transistor 117. The third transistor 117 is a PMOSFET. The third transistor 127 is an NMOSFET. In this embodiment, when the first regulation signal As1' or the second regulation signal As2' has a peak (not a signal desired to be sampled), by turning one of the third transistors 117 and 127 and turning off the other, a blanking time is generated to shield the corresponding peak so as to prevent injection of noise.

Figure 9:
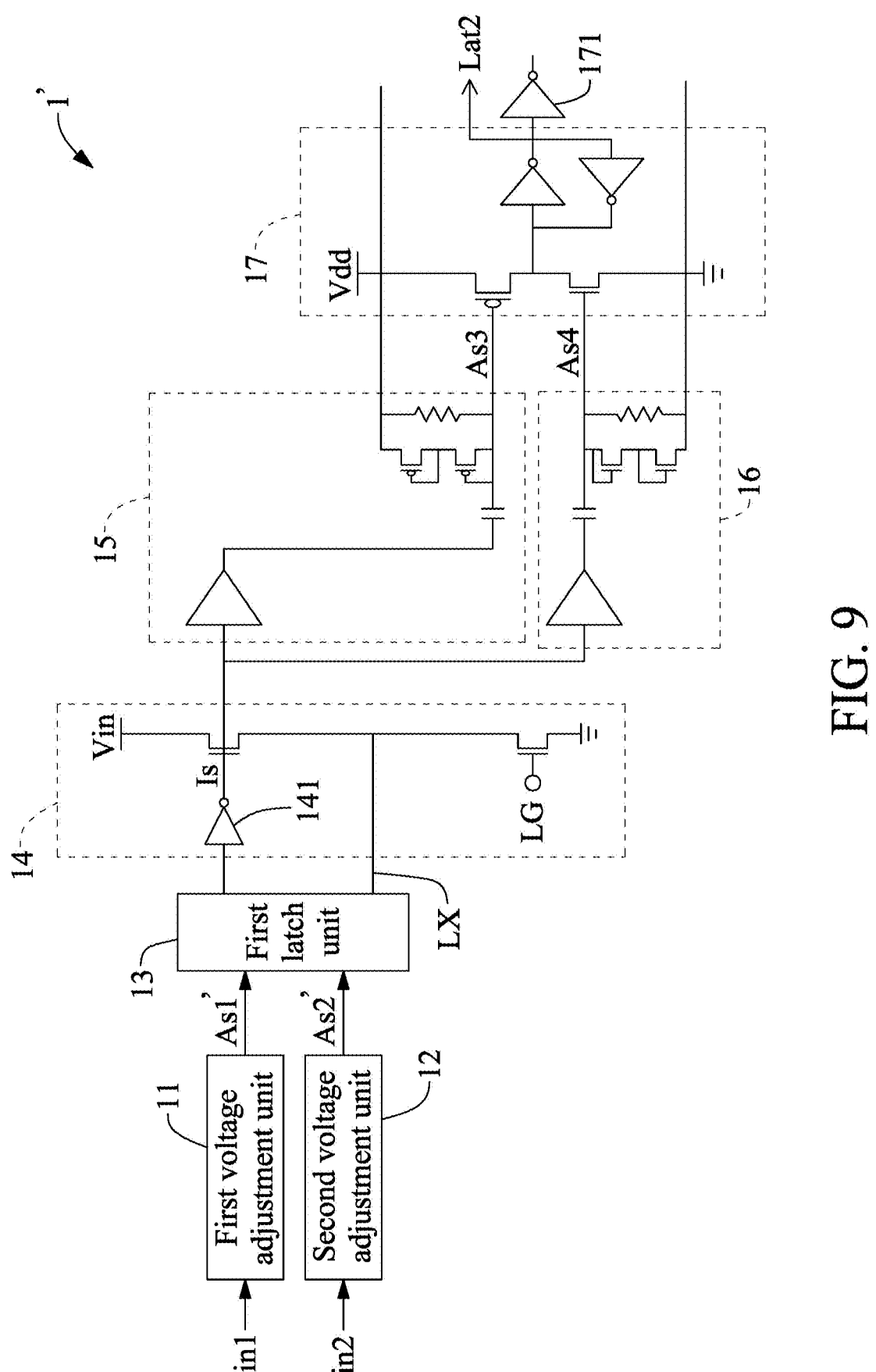
FIG. 9 is a circuit block diagram of a voltage level shifter according to yet another embodiment of the present disclosure.

Refer to FIG. 9 for a voltage level shifter 1' according to yet another embodiment. The voltage level shifter 1' further includes a third voltage regulation unit 15, a fourth voltage regulation unit 16 and a second latch unit 17.

The third voltage regulation unit 15 is coupled to the second end of the inverter 141 to receive the inverted signal Is, and accordingly generates an amplified third regulation signal As3. The fourth voltage regulation unit 16 is coupled to the second end of the inverter 141 to receive the inverted signal Is, and accordingly generates an amplified fourth regulation signal As4. The second latch unit 17 is coupled to the third voltage regulation unit 15 and the fourth voltage regulation unit 16 to receive the third regulation signal As3 and the fourth regulation signal As4, respectively, and accordingly generates a second latch signal Lat2 according to the third regulation signal As3 and the fourth regulation signal As4. Details of internal structures and configurations and as well as operation principles of the third voltage regulation unit 15, the fourth voltage regulation unit 16 and the second latch unit 17 are the same as those of the first voltage regulation unit 11, the second voltage regulation unit 12 and the first latch unit 13, respectively, and are thus omitted herein. It should be noted that, an output signal of the inverter 171 and the second latch signal Lat2 are signals detected by an upper bridge and returned to a lower bridge for further use, for example, for control for non-overlapping dead time, so as to ensure that the upper and lower bridges are simultaneously turned on.

In this embodiment, the input capacitors 32 and 42 (112 and 122) are used in substitution for transistors with large acceptable voltage differences of existing voltage level shifters, so as to form a single-chip, compact capacitive voltage level shifter. With the structure above, the voltage level shifter 1 (1') does not need to be provided with transistors with large acceptable voltage differences, is consisted of transistors of low voltage differences and has smaller circuit areas, and thus does not have different transition speeds resulted from changes in different processes, voltages or temperatures. Therefore, the voltage level shifter 1 (1') has a smaller propagation delay; in other words, the voltage level shifter (1') can provide higher speed performance. In addition, because the voltage level shifter 1 (1') does not need to be provided with transistors with large acceptable voltage differences, the voltage level shifter 1 does not involve high-voltage manufacturing processes and accordingly has lower manufacturing costs, and is free from the issue of being susceptible to influences of turning on of parasitic elements when electronic elements with large acceptable voltage differences are used as in the prior art.

The description above provides merely preferred embodiments of the present application, and is not to be construed as limitations to the scope of implementation of the present invention. All simple and equivalent variations and modifications made based on the scope of claims and the description of the present application are to be encompassed within the scope of the present application.

What is claimed is:

1. A voltage level shifter, comprising:
a first voltage regulation unit, receiving a first input signal and accordingly generating an amplified first regulation signal;
a second voltage regulation unit, receiving a second input signal and accordingly generating an amplified second regulation signal;
a first latch unit, coupled to the first voltage regulation unit and the second voltage regulation unit to receive the first regulation signal and the second regulation signal, respectively, and accordingly generating a first latch signal according to the first regulation signal and the second regulation signal; and
an output unit, coupled to the first latch unit to receive the first latch signal, and generating an output signal according to the first latch signal, an input voltage and a control signal, wherein a voltage of a high logic level of the output signal is greater than voltages of respective high logic levels of the first input signal and the second input signal;

wherein, each of the first voltage regulation unit and the second voltage regulation unit is a capacitively coupled voltage regulation unit and comprises an input capacitor which has no ground capacitance on one end thereof, and wherein the first input signal and the second input signal are mutually inverted signals, the input capacitor is a high-voltage parasitic capacitor and has a first end and a second end which has no ground capacitance, and the first voltage regulation unit and the second voltage regulation unit are symmetrical and each comprises:

a first buffer gate, having a first end receiving a corresponding one of the first input signal and the second input signal, and a second end coupled to the first end of the corresponding input capacitor and outputting a buffer signal;

a first transistor, having a first end, a second end coupled to a first voltage end, and a control end coupled to the second end of the input capacitor to receive the buffer signal;

a second transistor, having a first end coupled to the first latch unit and outputting a corresponding one of the first regulation signal and the second regulation signal, a second end coupled to the first end of the first transistor, and a control end receiving a corresponding one of a first switching signal and a second switching signal;

a first resistor, coupled between a second voltage end and the first end of the second transistor;

a second resistor, coupled between the second voltage end and the second end of the second transistor; and a clamp circuit, coupled between the control end of the first transistor and the first voltage end, operable to clamp the buffer signal which is erroneous.

2. The voltage level shifter according to claim 1, wherein a voltage of the second voltage end is greater than or less than a voltage of the first voltage end.

3. The voltage level shifter according to claim 1, further comprising:

a signal adjustment unit, receiving an input signal and coupled to the first voltage end, operable to detect whether a rising edge of the input signal is within a slope interval in which a voltage of the first voltage end rises, adjusting a position of the rising edge of the input signal if a detection result is affirmative to generate and output the first input signal and the second input signal to the first voltage regulation unit and the second voltage regulation unit, respectively, wherein a position of a rising edge of the first input signal is not within the slope interval in which the voltage of the first voltage end rises.

4. The voltage level shifter according to claim 3, wherein the signal adjustment unit comprises:

a detection circuit, coupled to the first voltage end, and detecting the voltage of the first voltage end to generate a detection signal; and a signal adjustment circuit, receiving the input signal, coupled to the detection circuit to receive the detection signal, and generating the first input signal and the second input signal according to the input signal, the detection signal and the control signal.

5. The voltage level shifter according to claim 4, wherein the detection circuit comprises:

a capacitor, having a first end coupled to the first voltage end, and a second end;

a first current mirror, coupled to the second end of the capacitor;

a second current mirror, coupled to the first current mirror; and a current source, coupled between the second current mirror and a low-voltage end, wherein a common node of the current source and the second current mirror outputs the detection signal.

6. The voltage level shifter according to claim 4, wherein the signal adjustment circuit comprises:

a logic gate, receiving the input signal, coupled to the detection circuit to receive the detection signal, and generating a logic signal according to the input signal and the detection signal; and an RS flip-flop, receiving the control signal, coupled to the logic gate to receive the logic signal, and generating the first input signal and the second input signal according to the logic signal and the control signal.

7. The voltage level shifter according to claim 1, wherein the first latch unit comprises:

a third transistor, having a first end coupled to a second voltage end, a second end, and a control end coupled to the first voltage regulation unit to receive the first regulation signal;

a fourth transistor, having a first end coupled to the second voltage end, a second end, and a control end coupled to the second voltage regulation unit to receive the second regulation signal; and a latch circuit, coupled to the second ends of the third transistor and the fourth transistor, operable to latch a potential of one of the second ends of the third transistor and the fourth transistor so as to generate the first latch signal.

8. The voltage level shifter according to claim 1, wherein the output unit comprises:

a second buffer gate, having a first end coupled to the first latch unit to receive the first latch signal, a second end coupled to a first voltage end, a third end coupled to a second voltage end, and an output end outputting a buffer signal;

a fifth transistor, having a first end receiving the input voltage, a second end coupled to the first voltage end and outputting the output signal, and a control end coupled to the output end of the second buffer gate to receive the buffer control signal; and a sixth transistor, having a first end coupled to the second end of the fifth transistor, a second end which is grounded, and a control end receiving the control signal.

9. A voltage level shifter, comprising:

a first voltage regulation unit, receiving a first input signal and accordingly generating an amplified first regulation signal;

a second voltage regulation unit, receiving a second input signal and accordingly generating an amplified second regulation signal;

a first latch unit, coupled to the first voltage regulation unit and the second voltage regulation unit to receive the first regulation signal and the second regulation signal, respectively, and accordingly generating a first latch signal according to the first regulation signal and the second regulation signal; and an output unit, coupled to the first latch unit to receive the first latch signal, and generating an output signal according to the first latch signal, an input voltage and a control signal, wherein a voltage of a high logic level of the output signal is greater than voltages of respective high logic levels of the first input signal and the second input signal;

wherein each of the first voltage regulation unit and the
second voltage regulation unit is a capacitively coupled
voltage regulation unit and comprises an input capaci-
tor which has no ground capacitance on one end
thereof, and wherein the second input signal and the first input signal
are in-phase signals, the input capacitor has a first end
and a second end which has no ground capacitance, the
second end of the input capacitor outputs a correspond-
ing one of the first regulation signal and the second
regulation signal, and each of the first voltage regula-
tion unit and the second voltage regulation unit further
comprises:

a first buffer gate, having a first end receiving a corre-
sponding one of the first input signal and the second
input signal, and a second end coupled to the first end
of the corresponding input capacitor and outputting a
buffer signal; and a clamp circuit, coupled between a corresponding one of
a first voltage end and a second voltage end and the
second end of the corresponding input capacitor, oper-
able to clamp a corresponding one of the first regulation
signal and the second regulation signal which is erro-
neous, wherein the clamp circuit comprises:

a first transistor and a second transistor, connected in
series between a corresponding one of the first voltage
end and the second voltage end and the second end of
the corresponding input capacitor; and a resistor, coupled between a corresponding one of the
first voltage end and the second voltage end and the
second end of the corresponding input capacitor.

10. The voltage level shifter according to claim 9, wherein
a potential of each of the first regulation signal and the
second regulation signal follows a potential of the first
voltage end.

11. The voltage level shifter according to claim 9, wherein
each of the first voltage regulation unit and the second
voltage regulation unit further comprises:

a third transistor, having a first end coupled to the second
end of the corresponding input capacitor, a second end
coupled to the corresponding resistor, and a control
end;

wherein, the control end of the third transistor of the first
voltage regulation unit is coupled to the second end of
the third transistor of the second voltage regulation
unit, and the control end of the third transistor of the
second voltage regulation unit is coupled to the second
end of the third transistor of the first voltage regulation
unit.

12. The voltage level shifter according to claim 9, wherein
the first latch unit comprises:

a fourth transistor, having a first end coupled to the second
voltage end, a second end, and a control end coupled to
the first voltage regulation unit to receive the first
regulation signal, the fourth transistor being a P-type
metal oxide semiconductor field-effect transistor
(PMOSFET);

a fifth transistor, having a first end coupled to the second
end of the fourth transistor, a second end coupled to the
first voltage end, and a control end coupled to the
second voltage regulation unit to receive the second
regulation signal, the fifth transistor being an N-type
metal oxide semiconductor field-effect transistor
(NMOSFET);

an output capacitor, coupled between the first voltage end
and the second voltage end; and a latch circuit, coupled to the first end of the fifth
transistor, operable to latch a potential of the first end
of the fifth transistor to generate the first latch signal.

13. The voltage level shifter according to claim 12,
wherein the output unit comprises:

an inverter, having a first end coupled to the first latch unit
to receive the first latch signal, and a second end
outputting an inverted signal;

a sixth transistor, having a first end receiving the input
voltage, a second end coupled to the first voltage end
and outputting the output signal, and a control end
coupled to the second end of the inverter to receive the
inverted signal; and a seventh transistor, having a first end coupled to the
second end of the sixth transistor, a second end which
is grounded, and a control end receiving the control
signal.

14. The voltage level shifter according to claim 13, further
comprising:

a third voltage regulation unit, coupled to the second end
of the inverter to receive the inverted signal, and
accordingly generating an amplified third regulation
signal;

a fourth voltage regulation unit, coupled to the second end
of the inverter to receive the inverted signal, and
accordingly generating an amplified fourth regulation
signal; and a second latch unit, coupled to the third voltage regulation
unit and the fourth voltage regulation unit to receive the
third regulation signal and the fourth regulation signal,
respectively, and accordingly generating a second latch
signal according to the third regulation signal and the
fourth regulation signal.

* * * * *